(12) United States Patent
Kajino

(10) Patent No.: US 6,600,404 B1
(45) Date of Patent: Jul. 29, 2003

(54) PLANAR COIL AND PLANAR TRANSFORMER, AND PROCESS OF FABRICATING A HIGH-ASPECT CONDUCTIVE DEVICE

(75) Inventor: Takashi Kajino, Chiba (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/228,971

(22) Filed: Jan. 12, 1999

(30) Foreign Application Priority Data

Jan. 12, 1998 (JP) ........................................... 10-003853
Jan. 12, 1998 (JP) ........................................... 10-003854

(51) Int. Cl.[7] ................................................. H01F 5/00
(52) U.S. Cl. ........................ 336/200; 336/232; 257/531
(58) Field of Search ................................. 336/200, 232, 336/220, 222, 182; 257/531

(56) References Cited

U.S. PATENT DOCUMENTS 4,392,013 A * 7/1983 Ohmura et al. ............ 174/68.5
5,430,424 A * 7/1995 Sato et al. .................. 336/200
5,545,916 A * 8/1996 Koullias ..................... 336/232

FOREIGN PATENT DOCUMENTS

| JP | 1-43039 | 9/1989 |
| JP | 7-142254 | 6/1995 |
| JP | 7-142256 | 6/1995 |

* cited by examiner

Primary Examiner—Tuyen T. Nguyen
(74) Attorney, Agent, or Firm—Oblon, Spivak, McClelland, Maier & Neustadt, P.C.

(57) ABSTRACT

A planar coil including and insulating substrate, and a coil conductive filament having a thickness of 20 to 400 $\mu$m and formed on at least one surface of the insulating substrate, the coil conductive filament having a gap whose aspect ratio (H/G) is at least 1. The coil conductive filament has a cross-section in a substantially mushroom shape having a head and a neck, the head has a width (L) which is a least twice as large as a width (l) of the neck thereof, at most 1.5 times as large as a height of the head, and at least twice as large as a minimum spacing (G) between adjacent coil conductive filaments.

8 Claims, 6 Drawing Sheets

PLANAR COIL AND PLANAR TRANSFORMER, AND PROCESS OF FABRICATING A HIGH-ASPECT CONDUCTIVE DEVICE

BACKGROUND OF THE INVENTION

The present invention relates generally to a planar coil and a plane transformer, and more particularly to a planar coil and a planar transformer capable of operating with small power of 10 W or less. The present invention is also concerned with a process of fabricating a high-aspect conductive device comprising a plurality of fine yet thick conductive patterns arranged side by side at a narrow spacing, for instance, a planar coil, and a printed circuit board.

Planar coils are widely used in the form of biaxial actuators for digital audio disks, and power sources or signal sources for artificial satellites, and fine-pitch printed circuit boards are employed as general-purpose parts of portable terminal equipment, and high-density packaged electronic equipment. Planar coils are also incorporated in thin-film heads.

As planar coils, and printed circuit boards capable of functioning as precise devices are now in growing demand, an arrangement comprising a plurality of fine yet thick conductive patterns, i.e., so-called high-aspect conductive patterns arranged side by side at a narrow spacing is greatly needed. So far, such a high-aspect conductive device has been fabricated by a process comprising steps of depositing a conductive thin film on an insulating substrate, applying a negative photoresist on the conductive thin film to form a resist pattern in a conventional manner, etching an exposed region of the conductive thin film, and finally stripping away the resist pattern.

However, a serious problem with such a process is that while the conductive thin film is etched, an etching solution burrows its way into a portion of the conductive thin film covered with the resist pattern, causing removal of the conductor at that portion by dissolution. This in turn causes the section of the remaining conductor to assume on a trapezoidal shape, resulting in considerable increases in the spacing between conductive patterns.

To solve this problem, it has been proposed to use a process wherein a conductive thin film is etched to form a spiral pattern thereon, and the conductive thin film is thickly plated in a selective fashion making use of an electric resistance difference between an insulating substrate and the conductive thin film (JP-A 58-12315). However, such as when the spiral pattern is especially formed on the conductive thin film that is a plating primer film, there is an increase in the wiring resistance of the primer film because the thickness of the conductive thin film is very small. This then renders it impossible to increase plating currents, resulting in an unavoidable increase in the length of time needed for plating. In addition, it is impossible to increase the thickness of the conductive pattern because the growth rate of plating is usually lacking in anisotropy.

There has also been known a process wherein a thick resist pattern is formed on a metal thin film provided all over the surface of an insulating substrate, a high-aspect conductor is then formed by pattern plating, followed by the stripping-away of the resist, and the metal thin film between lines is finally stripped away by dry etching such as ion milling. Since the upper limit to resist thickness is at most 50 μm, the thickness of the resulting conductive pattern is barely about 40 μm at most. To add to this, high-speed plating causes deformation of the resist wall due to its softness; there is no choice but to decrease the working current, with a working efficiency drop. Moreover, the need of special equipment incurs some extra expenses. Thus, many problems arise in putting this process to practical use.

When this process is applied to the fabrication of a planar coil, it is difficult to increase the thickness of a coil conductor itself. In addition, the formation of a conductive pattern by etching limits the spacing between filaments forming the coil conductor to at most about twice as large as the layer thickness of the coil conductor. In other words, the space factor of a coil conductive portion is too low to achieve favorable electric properties, because direct current resistance increases unavoidably.

One object of the invention is to provide a compact yet high-performance planar coil of low direct current resistance by increasing the layer thickness of a coil conductor and reducing the spacing between filaments forming the coil conductor, and a high-performance transformer using the same.

Another object of the invention is to provide a process of fabricating, with ease, a device comprising a plurality of fine yet thick conductive patterns, i.e., high-aspect conductive patterns arranged side by side at a narrow spacing, thereby providing a solution to various problems with conventional processes of fabricating high-aspect conductive devices.

SUMMARY OF THE INVENTION

As a result of study after study made to achieve a high-performance planar coil, the inventors have now found that each filament of a coil conductor is formed by anisotropic growth into a mushroomy shape in section, so that the coil conductor can have a height of at least 20 μm with a spacing of up to 20 μm between adjacent filaments, and hence the coil conductor can have improved electric properties due to an apparent space factor increase. This finding underlies the first aspect of the invention.

According to the first aspect of the invention, there is provided a planar coil comprising an insulating substrate and a 20 to 400-μm thick coil conductive filament formed on one or both surfaces of said substrate at an aspect ratio (H/G) of at least 1 at an gap position thereof, optionally with a protective metal plating thin-film layer provided over a surface thereof, characterized in that said coil conductive filament has a mushroomy shape in section, with a width (L) of a head of said section being at least twice as large as a width (l) of a neck thereof and at most 1.5 times as large as a height of said head, and being at least twice as large as a minimum spacing (G) in section between adjacent coil conductive filaments. According to the first aspect of the invention, there is also provided a planar transformer obtained by laminating such planar coils one upon another with an insulating film interleaved therebetween, and sandwiching the whole of the thus obtained multilayer structure between low-profile ferromagnetic cores.

As a result of study after study made of how to fabricate a planar coil, the inventors have now found that a plurality of high-aspect conductive patterns, each having a narrow width yet a large thickness, can be arranged side by side at a narrow spacing by using a positive photoresist as a photoresist for the formation of a mask pattern on a conductive thin-film layer, thereby additionally stripping away the photoresist between the conductive patterns by active beam irradiation after plating, and selectively stripping away a plating primer thin-film layer between the coil conductors while a protective thin-film layer formed on the coil conductors remains intact. This finding underlies the second aspect of the invention.

Figure 5:
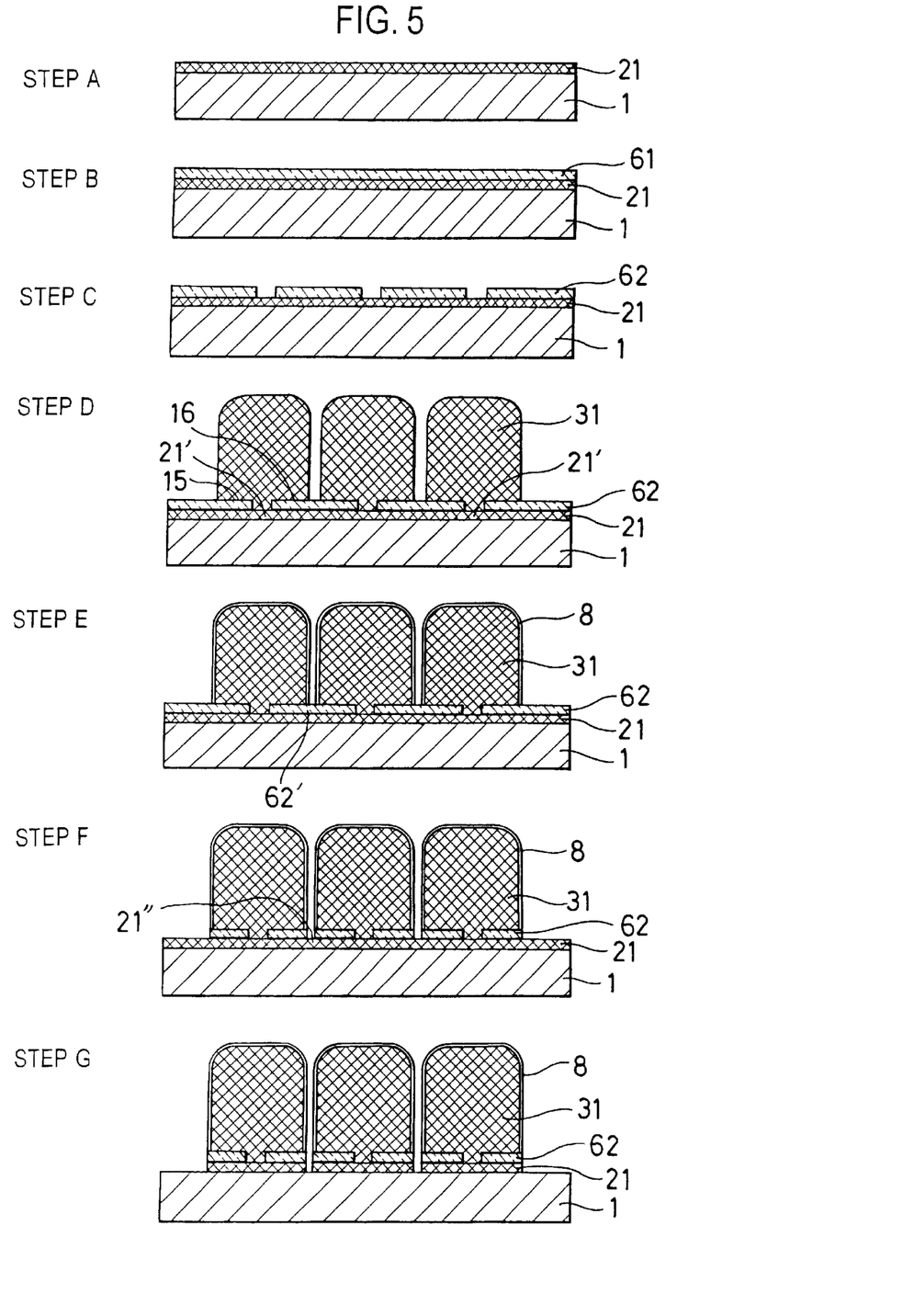
FIG. 5 illustrates in section the multilayer structure at steps according to one embodiment of the second aspect of the invention.

According to the second aspect of the invention, there is provided a process of fabricating a high-aspect conductive device, characterized comprising, as shown in FIG. 5, a step (A) of providing an electrically conductive primer thin-film layer 21 on an insulating substrate 1, a step (B) of laminating a positive photoresist layer 61 on said plating primer thin-film layer 21, a step (C) of applying photolithography to said positive photoresist layer 61 to form a photoresist mask pattern of said positive photoresist layer 61, a step (D) of carrying out plating so that a coil conductive plating layer 31 of a mushroomy shape in section can swell up on an exposed region 21' of said plating primer thin-film layer 21 and over regions 15 and 16 covered by said photoresist mask pattern in the vicinity of said exposed region, a step (E) of carrying out plating so that a protective metal thin-film layer 8 can be provided all over the coil conductive plating layer, a step (p) of irradiating an entire surface of a multilayer structure with an active beam and then developing said multilayer structure to strip away a photoresist mask pattern 62" exposed under openings in said coil conductive plating layer, and a step (G) of stripping away only an exposed plating primer thin-film layer 21" by selective etching, said steps (A) to (G) being successively carried out.

ADVANTAGES OF THE INVENTION

In the planar coil according to the first aspect of the invention, the thickness of the conductor can be increased while the spacing between coil conductive filaments is kept small, so that the direct current resistance of the planar coil can be reduced. This planar coil may be used to construct a planar transformer showing excellent electric properties even when operated with small power of up to 10 W.

The fabrication process according to the second aspect of the invention has the following advantages over a conventional process of fabricating planar coils.

(1) By using as the plating primer film the metal thin film provided all over the surface of the substrate, a large current can be so supplied that a high-aspect pattern can be formed and the given plating thickness can be obtained in one plating operation.

(2) All regions but the plating primer film under the openings in the conductor are covered with the resist, and the plating primer film in relatively thin. Accordingly, even when the conductor spacing is very narrow relative to the conductor height, high through-put can be achieved by wet etching yet at low running cost.

(3) The resist used for plating is a positive photoresist, and so the inter-conductor primer film can be selectively stripped away at post-treatment steps.

(4) The formed conductor itself can be used for exposure of the inter-conductor primer film for etching purposes. This can dispense with the use of a photomask, and awkward alignment, and so can simplify the fabrication process.

(5) The protective metal layer is usually of a few $\mu$m in thickness, and so can be formed within a short time of about 10 minutes immediately upon plating. Thus, the fabrication process can be simplified.

BRIEF EXPLANATION OF THE INVENTION

FIGS. 2(1), 2(2), 2(3) and 2(4) is a process sequence of steps of fabricating the planar coil according to the first aspect of the invention.

DETAILED EXPLANATION OF PREFERRED EMBODIMENTS OF THE INVENTION

The first aspect of the invention is now explained in detail with reference to the accompanying drawings.

Figure 1:
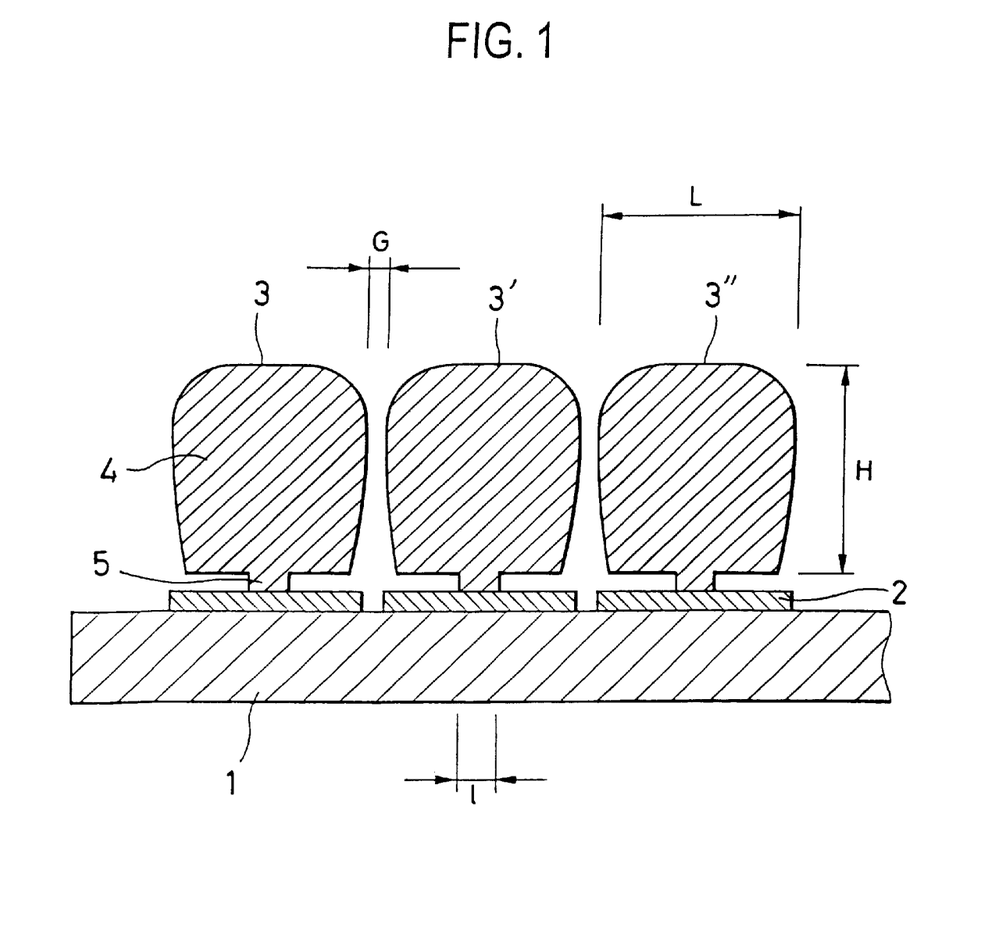
FIG. 1 is a partially cross-sectional view of one embodiment of the planar coil according to the first aspect of the invention.
Figure 2:
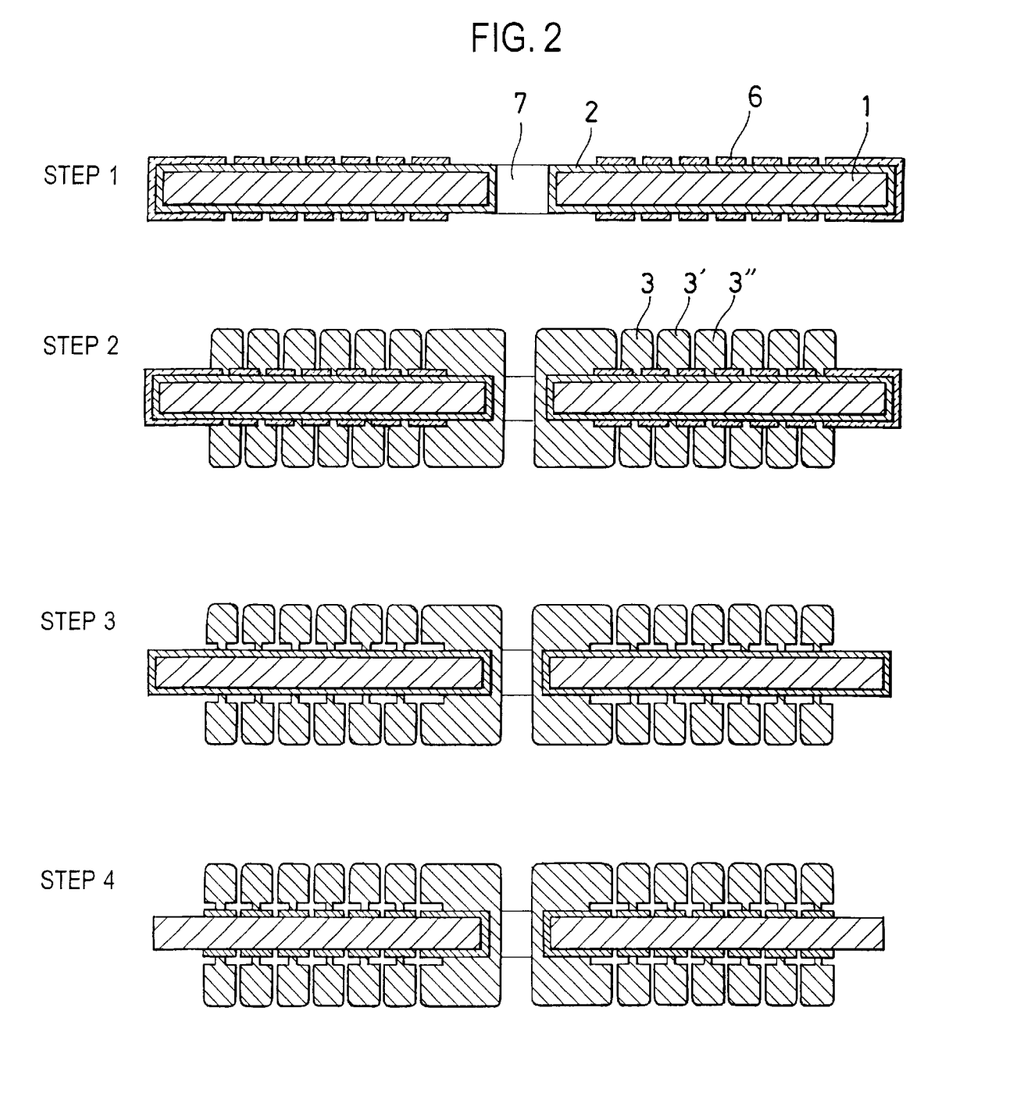

FIG. 1 is a partially enlarged cross-sectional view of the planar coil according to the invention. Coil conductive filaments 3, 3', 3", - - - are arranged side by side on an insulating substrate 1 with a metal thin-film layer 2 located between each filament and the insulating substrate. Each filament has a mushroomy section shape defined by a head 4 and a neck 5. It is then required that the width (L) of the head be at least twice, and preferably two to five times, as large as the width (l) of the neck, at most 1.5 times, and preferably 0.5 to 1.5 times as large as the height (H) of the head, and at least twice, and preferably 4 to 10 times, as large as the minimum spacing (G) between the coil conductive filaments. Each coil conductor filament has a thickness (height) of 20 to 400 $\mu$m, and preferably 50 to 300 $\mu$m.

FIG. 2 is a process sequence of steps of fabricating the planar coil according to the invention. A through-hole 2 is provided through a disk form of insulating substrate 1. Then, a metal thin-film layer 2 is formed on the substrate with a photoresist pattern layer 6, thereby obtaining a structure as shown in FIG. 2(1).

Using a metal, preferably the same metal as the metal thin-film layer 2, bright electroplating is then applied around an exposed region of the metal thin-film layer 2, thereby forming filaments 3, 3', 3", - - - side by side, each having a mushroomy section, as shown in FIG. 2(2).

Subsequently, the remaining resist is stripped off, as shown in FIG. 2(3), after which only the metal thin-film layer between the filaments is stripped away by selective etching, as shown in FIG. 2(4)

If desired in this case, the coil conductive filaments may be plated with a protective metal after high-aspect plating, thereby covering the surfaces of the filaments with the protective metal.

If proper plating conditions are selected to subject to bright electroplating the coil pattern of metal thin-film layer 2 exposed under the openings in the photoresist pattern layer 6, the growth rate of plating is then higher in the height direction than in the widthwise direction, so that the plating can swell up. Thus, mushroomy coil conductive filaments of low direct current resistance can be formed even in one operation.

In this case, the plating conditions depend on the composition of the plating bath used, the configuration of the plating tank used, and the stirring conditions applied to the bath. However, the optimum conditions may be easily determined by repetition of preliminary tests. Referring here to the current density, anisotropic growth must take place with at least 70% of limiting current density. It is understood that by the term "limiting current density" used herein is intended the upper limit to the current density, at which bright plating can give a gloss to the coating. A failure in obtaining the gloss results in an electric resistance increase and a reliability drop.

Referring here to the width of the neck of each filament in the coil conductor, the width of the metal thin film exposed under the openings in the resist pattern is preset at a minimum while the resolution of the resist, and the strength of the metal thin film 2 upon formation of the coil conductor are taken into account. Then, the condition under which the aspect ratio becomes highest is selected from plating conditions in this pattern. After the plating is grown to a given thickness, the minimum spacing between filaments is measured. Finally, the width of the region exposed under the openings in the resist pattern is increased by a value obtained by subtracting the design value from the measured value, so that the width of the neck of the coil conductor filament can be controlled.

Generally but not exclusively, a bright metal plating bath of low resistance may be used for the plating bath. However, a dull plating bath is not preferable because short-circuits occur with a decreasing spacing between coil conductive filaments.

According to the invention, a planar coil having a high-aspect ratio is obtainable probably for the following reasons. That is, when through-hole plating is carried out with a hole having a high aspect ratio, the thickness of the plating in the hole is smaller than that on the outside of the hole, and this tendency becomes more pronounced with an increasing aspect ratio. When a coil conductive pattern is formed by bright plating according to the invention, too, a phenomenon like this occurs. In the initial stage, the plating grows isotropically but, with an increasing plating thickness, the anisotropic growth of the plating begins to occur because the aspect ratio of a groove region becomes high, accordingly. Upon the formation of a head, this tendency is increasingly promoted with the result that the aspect ratio becomes higher and higher.

Figure 3:
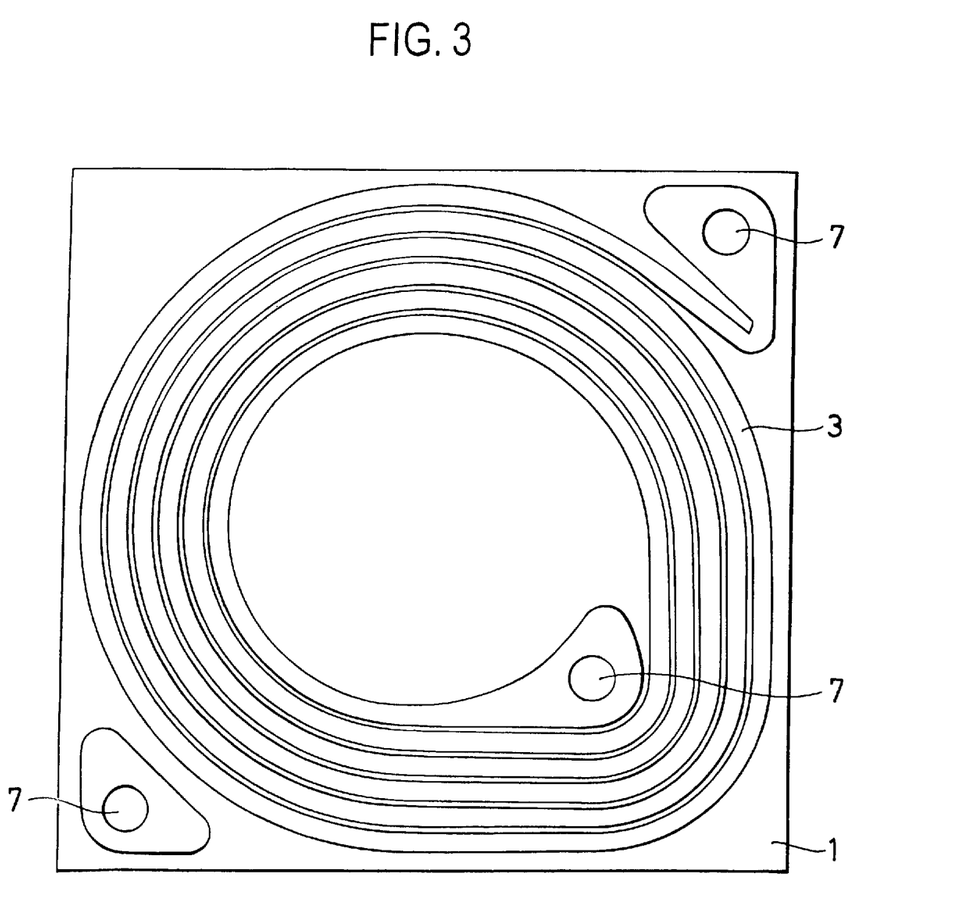
FIG. 3 is a plan view of one embodiment of the configuration of the planar coil according to the first aspect of the invention.

FIG. 3 is a plan view of one embodiment of the planar coil according to the invention. While, in FIG. 3, the coil pattern is shown in a round spiral form, it is to be understood that it may assume on other forms used for prior art planar coils, for instance, a square spiral form, and a line graph form, as desired.

In use, the thus obtained planar coil may be sandwiched between low-profile ferromagnetic cores. For these low-profile ferromagnetic cores, for instance, NiZn ferrite ERI cores of 1.2 mm in thickness may be used.

If a plurality of plane coils, each obtained according to the invention, are laminated one upon another with an insulating film interleaved therebetween to obtain a multilayer structure and the whole of the multilayer structure is sandwiched between low-profile ferromagnetic cores, it in then possible to obtain a planar transformer having very excellent electric properties.

The insulating film suitable for this case may be a 0.05-mm thick polyester or other plastic film, and the ferromagnetic cores used may be the same as mentioned above.

The second aspect of the invention is now explained in detail with reference to the accompanying drawings. FIG. 5 illustrates in section a planar coil at each seep to show one embodiment of the process of fabricating a planar coil according to the invention. In the process of the invention, an electrically conductive, plating primer thin-film layer 21 must be first provided on an insulating substrate 1 at step (A). For the insulating substrate 1, a suitable selection may be made from substrate materials ordinarily used so far for plane coils, for instance, glass epoxy sheet materials, plastics, single-crystal materials such as quartz, $SiO_2$, $Al_2O_3$, and various insulating ceramics such as ferrite. The thickness of the insulating substrate 1 may usually be selected from the range of 50 to 500 $\mu$m. For the plating primer thin-film layer 21 provided on the insulating substrate, a suitable selection may be made from film materials generally used for plating primer layers, for instance, copper, tin, and zinc. These materials may be provided on the insulating substrate by any desired means such as vapor deposition, electroplating, and electroless plating. It is suitable that the thickness of the primer thin-film layer 21 is in the range of 0.1 to 10 $\mu$m, and when a large current must pass through the primer thin-film layer, it is preferable that the thickness thereof is selected from the range of 0.5 to 10 $\mu$m.

It is here to be noted that the primer thin-film layer 21 may have a multilayer structure. For instance, the multilayer structure comprises a lower layer formed of a metal having good adhesion to the insulating substrate 1, such as Ti, Cr, and Ta and an upper layer laminated on the lower layer and formed of a metal having good electrical conductivity. Preferably in this case, the thickness of the lower layer is selected from the range of 5 to 30 nm and the thickness of the upper layer is selected from the range of 100 to 500 nm.

At step (B), a positive photoresist layer 61 is then laminated on the insulating layer 1 with the primer thin-film layer 21 formed at stpe (A).

For the process of the invention, it is required that a part of the photoresist mask pattern 62 obtained from the positive photoresist layer 61 be stripped away by exposure at a later step. For this reason, it is required to use the positive photoresist, because a negative photoresist, once it has been exposed to light, cannot be selectively stripped away.

For the positive photoresist layer 61, use may be made of a resist that can be solubilized by irradiation with active beams such as ultraviolet radiation, electron beams, X-rays, and laser beams. In the invention, a suitable selection may be made from positive photoresists known so far in the art. Typical examples of such a positive photoresist are poly (methyl vinyl ketone), poly(vinyl phenyl ketone), polysulfone, polyolefin-sulfone, poly(hexamethylene-α-toluxylylamide), poly(methyl methacrylate) resists, and novolak-diazoquinone resists.

The thickness of the positive photoresist layer 61 may be selected from the range of 0.1 to 50 $\mu$m. At a thickness of less than 0.1 $\mu$m, it is difficult to form a uniform mask pattern, and it is impossible to provide perfect protection to the plating primer thin-film layer 21 during etching. At a thickness exceeding 50 $\mu$m, much time is needed for exposure for resist pattern formation, resulting in a working efficiency drop. The positive photoresist layer 61 may be laminated on the insulating substrate by conventional techniques such as doctor knife or spin coating, or electrodeposition.

The thinner the positive photoresist layer 61, the shorter is the stem of the mushroomy section of a coil conductive plating layer formed at the subsequent step, and the thicker the positive photoresist layer 61, the longer the stem (neck) is.

At step (C) subsequent to step (B), the positive photoresist layer 61 is irradiated with active beams such as ultraviolet radiation, electron beams, X-rays, and laser beams by ordinary photolithography using, for instance, a transparent plate with the required mask pattern carried thereon, whereby only the exposed regions are decomposed to make them soluble in a solvent. Then, the photoresist was developed to strip away the resist from the exposed regions alone, thereby forming a photoresist mask pattern 62.

At step (D) of the process of the invention, electroplating is performed using the plating primer thin-film layer 21' exposed under the openings in the mask pattern 62 as one electrode, so that a coil conductive plating layer 31 of mushroomy shape in section can swell up on the plating primer thin-film layer 21' and over surfaces 15 and 16 of the photoresist mask pattern 62 on both sides of the plating primer thin-film layer 21'.

Examples of the composition of the plating bath to be used are set out below. A copper sulfate bath comprising 100 to 200 g/l of $CuSO_4 \cdot 5H_2O$ and 30 to 300 g/l of $H_2SO_4$, a copper fluoroborate plating bath comprising 250 to 400 g/l of $Cu(BF_4)_2$ and 1 to 5 g/l of $HBF_4$, and a cyanide plating bath comprising 60 to 80 g/l of CuCN, 70 to 90 g/l of NaCN and 20 g/l of KOH may be used for copper plating, and an acid bath comprising 350 to 450 g/l of $ZnSO_4 \cdot 7H_2O$, 10 to 30 g/l of $AlCl_3 \cdot 6H_2O$, 10 to 20 g/l of $CH_3COONa$ and 100 to 120 g/l of grape sugar, and an alkali bath comprising 50 to 70 g/l of $Zn(CN)_2$, 30 to 50 g/l of NaCN and 70 to 90 g/l of NaOH may be used for zinc plating. A sulfate bath comprising 80 to 120 g/l of $SnSO_4$, 80 to 120 g/l of $H_2SO_4$, 80 to 120 g/l of cresol sulfonate and 1 to 5 g/l of gelatin, and a fluoroborate bath comprising 150 to 250 g/l of $Sn(BF_4)_2$, 80 to 120 g/l of $HBF_4$, 23 to 30 g/l of $H_3BO_3$ and 3 to 8 g/l of gelatin may be used for tin plating. Generally, these plating baths may be used at a bath temperature of 25 to 65° C. and a current density of 0.5 to 10 $A/cm^2$.

For the coil conductive plating layer 31, it is preferable to select the same material as in the plating primer thin-film layer provided at step (A). However, it is acceptable to use another material as desired.

At step (E), a protective metal thin-film layer 8 is then coated on the swelling coil conductive plating layer 31. For the protective thin-film layer, it is required to use an electrically conductive material resistant to an etching solution capable of solubilizing the plating primer thin-film layer 21 provided at step (A). When, for instance, copper is used for the plating primer thin-film layer, nickel, chromium and a solder alloy may be used. In addition, gold, silver, platinum, etc. may also be used. This step may be carried out by electroplating or electroless plating.

Examples of the plating bath used at step (E) are set out below. A normal bath comprising 100 to 200 g/l of $NiSO_4 \cdot 7H_2O$, 10 to 20 g/l of $NH_4Cl$ and 10 to 20 grams of $H_3BO_3$, an improved watts nickel bath comprising 300 to 450 g/l of $NiSO_4 \cdot 7H_2O$, 45 to 60 g/l of $NiCl_2 \cdot 6H_2O$ and 35 to 40 g/l of $H_3BO_3$, and a sulfamate bath comprising 400 to 450 gram/liter of nickel sulfamate, 30 to 35 g/l of $H_3BO_3$ and 0.5 to 1.0 gram/liter of a wetting agent may be used for nickel plating, and a chromate bath comprising 200 to 270 g/l of $CrO_3$, and 1.0 to 3.0 g/l of $H_2SO_4$ optionally with 5 to 10 g/l of $Na_2SiF_6$ may be used for chromium plating. Generally, the conditions for using these plating baths may be selected from the range of a bath temperature of 20 to 75° C. and a current density of 0.5 to 60 $A/dm^2$.

Furthermore, a cyanide bath comprising 30 to 40 g/l of AgCN, 50 to 65 g/l of KCN, and 40 to 50 g/l of $K_2CO_3$ may be used for silver plating and a cyanide bath comprising 1.5 to 3.0 g/l of Au, 10 to 20 g/l of KCN, and 4 to 8 g/l of $Na_2HPO_4$ may be used for gold plating. The bath temperature may be 20 to 30° C. for the former, and 60 to 70° C. for the latter, and the current density may be 0.3 to 1.5 $A/dm^2$ for the former, and 0.1 to 0.5 $A/dm^2$ for the latter.

The thickness of this plating layer is suitably selected from the range of 1 to 5 µm, and may be controlled depending on the spacing between it and the adjacent coating layer.

At step (F) of the process of the invention, the entire surface of the thus obtained multilayer structure is irradiated from above with active beams, e.g., ultraviolet radiation to make only a region 62' of the photoresist pattern between the coil conductors soluble in a solvent. Then, development treatment is performed to strip away the used region to expose a plating primer thin-film layer 21" under the region 62".

At the final step (G), the remnants of the plating primer thin-film layer provided at step (A) and exposed at step (F) are selectively etched away to obtain planar coil.

For the etching solution in this case, it is required to use an etching solution that causes no damage to the protective metal thin-film layer 8 provided at step (E), and is capable of selectively etching away only the plating primer thin-film layer 21 provided at step (A).

Figure 6:
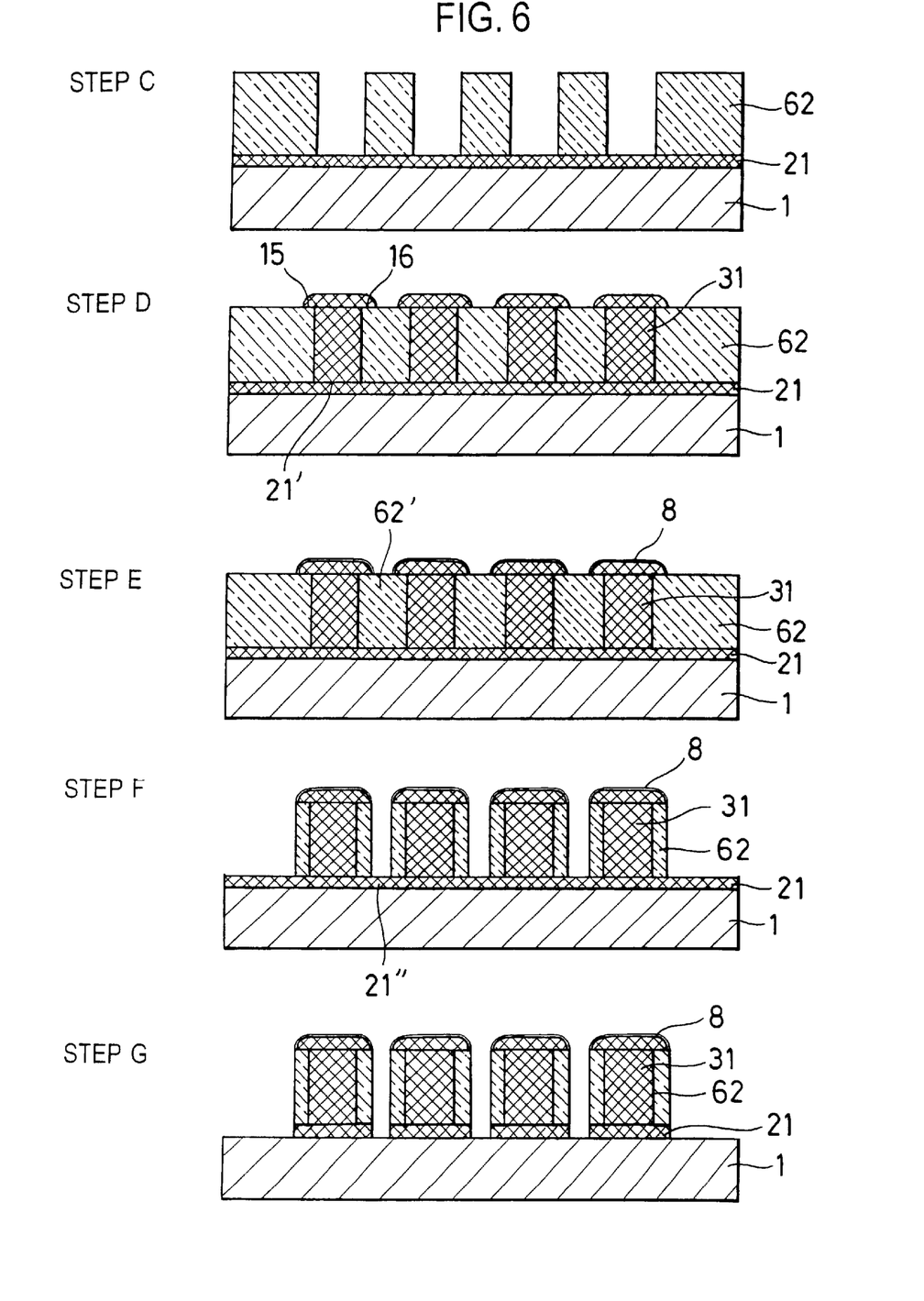
FIG. 6 illustrates in section the multilayer structure at steps according to another embodiment of the second aspect of the invention.

FIG. 6 is a process sequence of steps different from that in FIG. 5. At step (B) of this process, the positive photoresist is laminated on the primer thin-film layer more thickly than at step (B) of the process according to the first aspect of the invention, thereby forming a coil conductor having a long and thick stem in section.

As in FIG. 5, a plating primer thin-film layer 21 is provided on an insulating substrate 1 at step .(A), and a photoresist is coated on the primer thin-film layer at a larger thickness, for instance, a dry thickness of 5 to 50 gm.

As in the process shown in FIG. 5, an intermediate having such a section as shown in FIG. 6 is formed through steps (C), (D), (E), and (F). At the final step (G), a planar coil having such a sectional shape as shown is obtained.

It is here to be noted that like numeral references in FIG. 6 indicate like numeral references in FIG. 5.

This process of the invention may also be applied to the fabrication of a planar coil of a composite structure comprising a multilayer wherein plating primer thin-film layers and positive photoresist layers are symmetrically formed on both surfaces of an insulating substrate, with a through-hole for connection to a double-sided coil.

While the fabrication process has been explained with reference to a planar coil, it is to be understood that other high-aspect conductive device, e.g., a printed circuit board, too, may be fabricated by a similar process.

It is here to be noted that the second aspect of the invention is preferably used for the fabrication of the planar coil or planar transformer according to the first aspect of the invention.

EXAMPLE

The present invention is now be explained in further detail with reference to some examples.

Example 1-1

Examples regarding the first aspect of the invention are given below.

To fabricate 284 coils on a 3-inch substrate, the following operations were carried out. A through-hole of 0.2 mm in diameter was provided through an unclad FR4 substrate (of 100 μm in thickness) at a given position thereof, and 1-μm thick copper layers were formed on both surfaces of the substrate, using an electroless copper plating solution.

A positive photoresist was spin-coated on each copper layer at a dry thickness of 5 μm.

Then, the resist was stripped away from the circumference of the through-hole. At the same time, a pattern having a resist pattern width of 90 μm and a resist pattern spacing (i.e., a line width of the conductor exposed) of 20 μm was provided by photolithography to form a coil portion. The through-hole was provided to make connections between the copper layers on both surfaces of the substrate. A pattern of a portion with the resist stripped away therefrom, i.e., the coil portion was in a round spiral form having an innermost radius of 0.9 mm and 11.5 turns.

This was plated in a bright copper sulfate plating bath. The concentration of copper sulfate in a plating solution was 70 g/l, and the plating solution temperature was 25° C. A pipe with an orifice was located near a cathode to inject the plating solution therefrom at 20 mm/sec., thereby performing plating at a current density of 2.5 A/dm$^2$ until a plating thickness of 150 μm was obtained. At this time, the spacing between conductors was 10 μm.

Subsequently, the resist was stripped away, and the underlying copper film was etched by ion milling to form a coil conductive portion, which was in turn cut to a single planar coil. Each of the thus obtained 284 planar coils was found to have an outer size of 3.1×3.1×0.4 mm. Then, the thickness (H) of the coil conductive layer was 150 μm, the spacing (G) between the coil conductive filaments was 10 μm, the width (L) of the head was 100 μm, and the width (l) of the neck was 20 μm, with an L/l ratio of 5, an L/H ratio of 0.67, and an L/G ratio of 10. The planar coil was found to have such electric properties as represented by a direct current resistance of 0.1 Ω and an inductance value of 0.37 μH.

For the purpose of comparison, coils with the same pattern were fabricated on a 100-μm thick FR4 substrate with 36-μm copper foils clad on both its surfaces by an ordinary process of fabricating printed circuit boards. Considerable yield reductions were observed because of fine patterns. A good-quality coil out of the obtained coils was found to have such electric properties as represented by a direct current resistance of 1.1 Ω and an inductance value of 0.37 μH, and an outer size of 3.1×3.1×0.2 mm.

From these results, it ie understood that the direct current resistance of the planar coil according to the invention can be reduced to 1/10 or below of that of the planar coil obtained by the ordinary process of fabricating printed circuit boards.

Comparative Example 1

In Example 1-1, a coil with the same widths of the neck and head in section of a conductor was formed by a pattern plating technique. That is, the same substrate was provided thereon with underlying copper films as in Example 1-1, a resist pattern of 35 μm in thickness and 10 μm in width was formed at a gap position between coil conductive filaments, and plating was carried out at a thickness of 30 μm under the same conditions as in Example 1-1. This operation was repeated five times. Following this, the resist was stripped away to etch the underlying copper film between the conductors by ion milling, thereby forming a coil with the same widths of the neck and head in section on one surface of the substrate. At this time, the amount of warpage of the substrate was 1.2 mm. On the other hand, coils were formed on only one surface of the substrate as in Example 1-1. The amount of warpage of the substrate was then found to be 0.25 nm. It is thus understood that the amount of warpage of the substrate can be reduced to 1/5 by making the diameter of the neck small.

Example 1-2

A through-hole of 0.2 mm in diameter was provided through the same unclad FR4 substrate as in Example 1-1 at a given position thereof, and 1-μm thick copper layers were formed on both surfaces of the substrate, using an electroless copper plating solution.

A positive photoresist was spin-coated on each copper layer at a dry thickness of 5 μm, and a pattern having a resist pattern width of 110 μm and a resist pattern spacing (i.e., a line width of the conductor exposed) of 20 μm was provided by photolithography. The through-hole was provided to make connections between the copper layers on both surfaces of the substrate. A pattern of a portion with the resist stripped away therefrom, i.e., a coil portion was in a round spiral form having an innermost radius of 0.9 mm and 9.5 turns.

This was plated in a bright copper sulfate plating bath. The concentration of copper sulfate in a plating solution was 70 g/l, and the plating solution temperature was 25° C. A pipe with an orifice was located near a cathode to inject the plating solution therefrom at 20 mm/sec., thereby performing plating at a current density of 2.5 A/dm$^2$ until a plating thickness of 200 μm was obtained. At this time, the spacing between conductors was 10 μm. The resist pattern spacing was increased by 20 μm as compared with Example 1-1, so that the height (thickness) of the conductor could be increased.

Subsequently, the resist was stripped away, and the underlying copper film was etched by ion milling to form a coil conductive portion, which was in turn cut to a single planar coil. Each of the thus obtained 284 planar coils was found to have an outer size of 3.1×3.1×0.4 mm. Then, the thickness (M) of the coil conductive layer was 200 μm, the spacing (G) between the coil conductive filaments was 10 μm, the width (L) of the head was 100 μm, and the width (l) of the neck was 20 μm, with an L/l ratio of 5, an L/H ratio of 0.5, and an L/G ratio of 10. The planar coil was found to have such electric properties as represented by a direct current resistance of 0.05 Ω and an inductance value of 0.26

For the purpose of comparison, coils with the same pattern were fabricated on a 100-μm thick FR4 substrate with 36-μm copper foils clad on both its surfaces by an ordinary process of fabricating printed circuit boards. Considerable yield reductions were observed because of fine patterns. A good-quality coil out of the obtained coils was found to have such electric properties as represented by a direct current resistance of 0.9 Ω and an inductance value of 0.37 μH, and an outer size of 3.1×3.1×0.2 mm.

From these results, it is understood that the direct current resistance of the planar coil according to the invention can be reduced to 1/10 or below of that of the planar coil obtained by the ordinary process of fabricating printed circuit boards.

A through-hole of 0.2 mm in diameter was provided through the same unclad FR4 substrate as in Example 1-1 at a given position thereof, and 1-μm thick copper layers were formed on both surfaces of the substrate, using an electroless copper plating solution.

A positive photoresist was spin-coated on each copper layer at a dry thickness of 5 μm, and a pattern having a resist pattern width of 90 μm and a resist pattern spacing (i.e., a line width of the conductor exposed) of 20 μm was provided by photolithography. The through-hole was provided to make connections between the copper layers on both surfaces of the substrate. A pattern of a portion with the resist stripped away therefrom, i.e., a coil portion was in a round spiral form having an innermost radius of 0.9 mm and 11.5 turns.

This was plated in a bright copper sulfate plating bath. The concentration of copper sulfate in a plating solution was 110 g/l, and the plating solution temperature was 35° C. A pipe with an orifice was located near a cathode to inject the plating solution therefrom at 50 mm/soc., thereby performing plating at a current density of 9 A/dm$^2$ until a plating thickness of 150 $\mu$m was obtained. At this time, the spacing between conductors was 10 $\mu$m.

Subsequently, the resist was stripped away, and the underlying copper film was etched by ion milling to form a coil conductive portion. Each of the thus obtained planar coils was found to have an outer size of 3.1×3.1×0.4 mm. Then, the thickness (H) of the coil conductive layer was 150 $\mu$m, the spacing (G) between the coil conductive filaments was 10 $\mu$m, the width (L), of the head was 100 $\mu$m, and the width (l) of the neck was 20 $\mu$m, with an L/l ratio of 5, an L/H ratio of 0.67, and an L/G ratio of 10. The planar coil was found to have such electric properties as represented by a direct current resistance of 0.1 $\Omega$ and an inductance value of 0.37 $\mu$H.

For the purpose of comparison, coils with the same pattern were fabricated on a 100-$\mu$m thick FR4 substrate with 36-$\mu$m copper foils clad on both its surfaces by an ordinary process of fabricating printed circuit boards. Considerable yield reductions were observed because of fine patterns. A good-quality coil out of the obtained coils was found to have such electric properties as represented by a direct current resistance of 1.1 $\Omega$ and an inductance value of, 0.37 $\mu$H, and an outer size of 3.1×3.1×0.2 mm.

From these results, it is understood that the direct current resistance of the planar coil according to the invention can be reduced to 1/10 or below of that of the planar coil obtained by the ordinary process of fabricating printed circuit boards.

Example 1-4

An NiZn ferrite substrate having a diameter of 3 inches, a thickness of 350 $\mu$m and a relative permeability of 800 was provided on both its surfaces with 1-$\mu$m thick copper layers, using an electroless copper plating solution.

A positive photoresist was spin-coated on each copper layer at a dry thickness of 5 $\mu$m, and a pattern having a resist pattern width of 90 $\mu$m and a resist pattern spacing (i.e., a line width of the conductor exposed) of 20 $\mu$m was provided by photolithography. A pattern of a portion with the resist stripped away therefrom, i.e., a coil portion was in a round spiral form having an innermost radius of 0.9 mm and 5.75 turns.

This was plated in a bright copper sulfate plating bath. The concentration of copper sulfate in a plating solution was 70 g/l, and the plating solution temperature was 25° C. Plating was carried out at a current density of 2.5 A/dm$^2$ as in Example 1-1 until a plating thickness of 150 $\mu$m was obtained. At this time, the spacing between conductors was 10 $\mu$m.

Subsequently, the resist was stripped away to etch the underlying copper layer by ion milling, thereby forming a coil conductive portion. Then, a photosensitive epoxy resin was coated over the coil conductive portion with gaps by a curtain coating technique, followed by pre-curing. After this, a contact hole was provided in the cured epoxy resin at a given position thereof, using a conventional photolithography technique, followed by curing. Then, the same operation as mentioned above was repeated using the photosensitive epoxy resin as an insulating substrate, thereby forming a second coil layer. In this way, an assembly of mulitilayer planar coils was obtained. Each of planar coils obtained by dividing this assembly was found to have an outer size of 3.1×3.1×0.7 mm. Then, the thickness (a) of the coil conductive layer was 150 $\mu$m, the spacing (G) between the coil conductive filaments was 10 $\mu$m, the width (L) of the head was 100 $\mu$m, and the width (l) of the neck was 20 $\mu$m, with an L/l ratio of 5, an L/H ratio of 0.67, and an L/G ratio of 10. The planar coil was found to have such electric properties as represented by a direct current resistance of 0.1 $\Omega$ and an inductance value of 0.6 $\mu$H. The inductance value of the planar coil showed an about 50% increase with respect to that of the planar coil according to Example 1-1.

Example 1-5

An NiZn composite ferrite substrate (consisting of 70% by weight of ferrite powders and 30% by weight of epoxy resin) having a diameter of 3 inches and a thickness of 300 $\mu$m was provided on both its surfaces with 1-$\mu$m thick copper layers, using an electroless copper plating solution.

A positive photoresist was spin-coated on each copper layer at a dry thickness of 5 $\mu$m, and a pattern having a resist pattern width of 90 $\mu$m and a resist pattern spacing (i.e., a line width of the conductor exposed) of 20 $\mu$m was provided by photolithography. A pattern of a portion with the resist stripped away therefrom, i.e., a coil portion was in a round spiral form having an innermost radius of 0.9 mm and 5.75 turns.

This was plated in a bright copper sulfate plating bath. The concentration of copper sulfate in a plating solution was 70 g/l, and the plating solution temperature was 25° C. Plating was carried out at a current density of 2.5 A/dm$^2$ as in Example 1-1 until a plating thickness of 150 $\mu$m was obtained. At this time, the spacing between conductors was 10 $\mu$m.

Subsequently, the resist was stripped away to etch the underlying copper layer by ion milling, thereby forming a coil conductive portion. Then, a photosensitive epoxy resin was coated over the coil conductive portion with gaps by a curtain coating technique, followed by pre-curing. After this, a contact hole was provided in the cured epoxy resin at a given position thereof, using a conventional photolithography technique, followed by curing. Then, the same operation as mentioned above was repeated using the photosensitive epoxy resin as an insulating substrate, thereby forming a second coil layer. In this way, an assembly of mulitilayer planar coils was obtained. Each of planar coils obtained by dividing this assembly was found to have an outer size of 3.1×3.1×0.6 mm. Then, the thickness (H) of the coil conductive layer was 150 $\mu$m, the spacing (G) between the coil conductive filaments was 10 $\mu$m, the width (L) of the head was 100 $\mu$m, and the width (l) of the neck was 20 $\mu$m, with an L/l ratio of 5, an L/H ratio of 0.67, and an L/G ratio of 10. The planar coil was found to have such electric properties as represented by a direct current resistance of 0.1 $\Omega$ and an inductance value of 0.48 $\mu$H. The inductance value of the planar coil showed an about 30% increase with respect to that of the planar coil according to Example 1-1.

Example 1-6

After the coil prepared in Example 1-1 was drilled in its middle position, it was sandwiched between NiZn EI ferrite cores, each having an outer size of 3.2×3.2×1.3 mm to form a planar coil. At this time, the planar coil had an inductance value of 11 μH about 30 times as large as that in Example 1-1.

Example 1-7

A through-hole of 0.2 mm in diameter was provided through the same unclad FR4 substrate as in Example 1-1 at a given position thereof, and 1-μm thick copper layers were formed on both surfaces of the substrate, using an electroless copper plating solution.

A positive photoresist was spin-coated on each copper layer at a dry thickness of 5 μm, and a pattern having a resist pattern width of 200 μm and a resist pattern spacing (i.e., a line width of the conductor exposed) of 20 μm was provided by photolithography. The through-hole was provided to make connections between the copper layers on both surfaces of the substrate. A pattern of a portion with the resist stripped away therefrom, i.e., a coil portion was in a round spiral form having an innermost radius of 0.9 mm and 6 turns.

This was plated in a bright copper sulfate plating bath. The concentration of copper sulfate in a plating solution was 70 g/l, and the plating solution temperature was 25° C. The plating solution was stirred at a cathode rocking speed of 3 mm/sec., a stroke of 100 mm, and a current density of 2.5 A/dm² until a plating thickness of 150 μm was obtained. The space between conductors was 10 μm.

Then, the resist was stripped away to etch the underlying copper film by ion milling, thereby forming a coil conductive portion. This coil conductive portion had an outer size of 3.1×3.1×0.4 mm, and such electric properties as represented by a direct current resistance of 0.5 Ω.

This was laminated on the planar coil obtained in Example 1-1 upon drilling in its middle position, with an insulating film interleaved between them. The whole of the multilayer assembly was sandwiched between NiZn EI ferrite cores, each having an outer size of 3.2×3.2×1.7 mm, thereby forming a planar transformer. The coupling coefficient was found to be 0.95 as measured at a frequency of 500 kHz.

Reference Example 1

A sample (A) where the head width (L) of the coil conductive filament was 100 μm, and a sample (B) where the head width (L) was 170 μm were plated at the same spacing (G) of 10 μm between conductor filaments. At varying (L-1)/2 values, i.e., varying lengths of the pilei of mushroomy sections, changes in the conductor height (H) were measured. The results are plotted in FIG. 4, in which C represents the results of isotropic growth for reference purposes.

Figure 4:
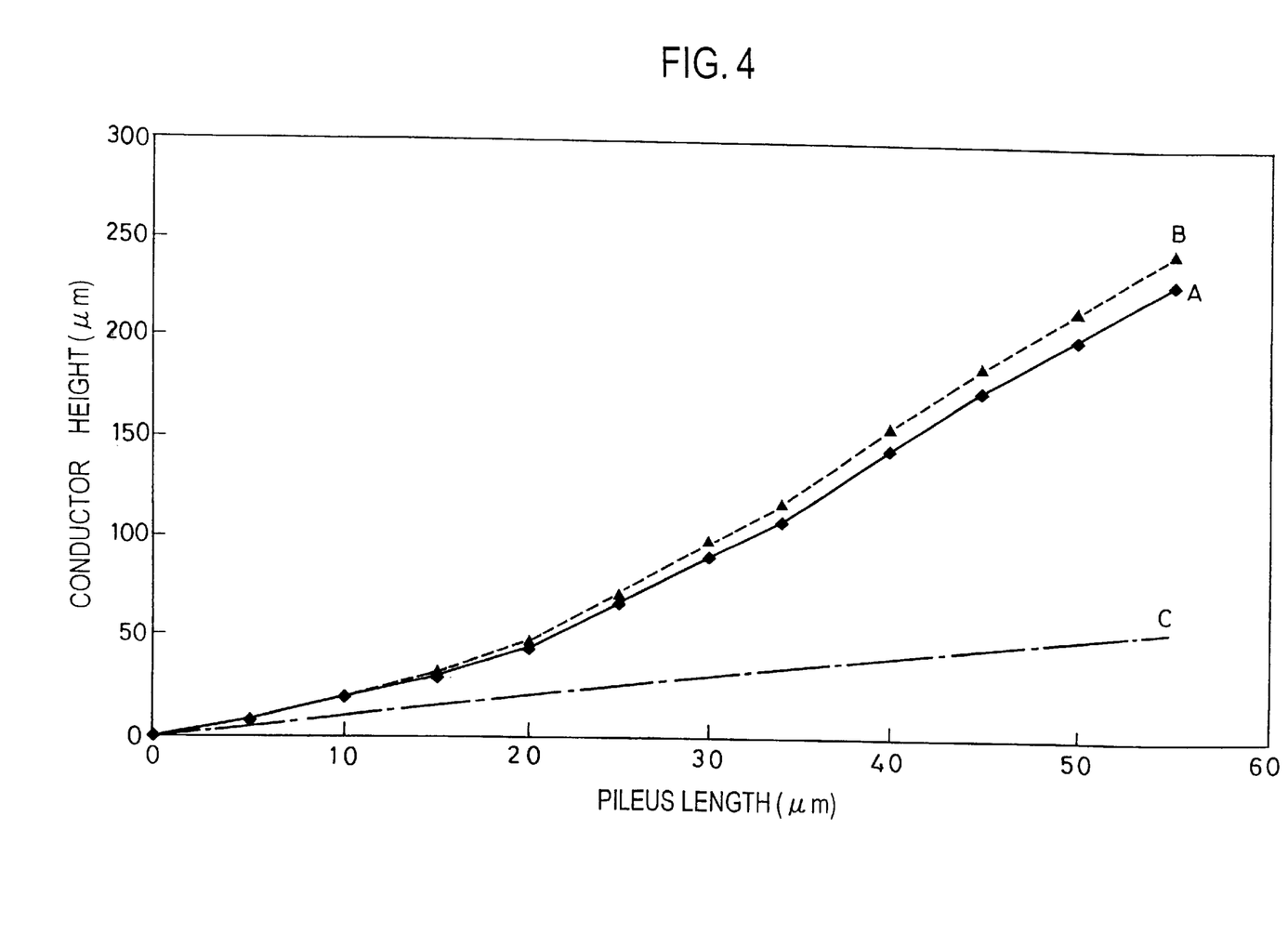
FIG. 4 is a graph showing the relationship between the length of the pileus and the height of the conductor in the planar coil according to the first aspect of the invention.

From the results given in FIG. 4, it is understood that the transverse growth rate of plating is reduced by making the length of the pileus of the overhang. Accordingly, the thickness (height) of the conductor can be increased while the inter-conductor spacing is kept constant, so that a planar coil of low direct current resistance can be obtained.

It is also understood that the longer the pileus, the thicker the conductor can be.

Example 2-1

The following examples are directed to the second aspect of the invention.

A through-hole of 0.2 mm in diameter was provided through a 100-μm thick glass epoxy substrate at a given position thereof, which substrate was prepared for the fabrication of 284 coils and had a diameter of 3 inches. After this, 1-μm thick copper layers were plated on both surfaces of the substrate, using an electroless copper plating solution ("Build Copper", Okuno Pharmaceutical Co., Ltd.).

Then, a positive photoresist ("PMER P-AR900", Tokyo Oka Kogyo Co., Ltd.) was spin-coated on each copper layer at a dry thickness of 5 μm, and exposed to light and developed an a conventional manner, thereby forming a resist pattern having a pattern width of 90 μm and a pattern spacing of 20 μm. The thus obtained resist pattern with a portion of resist stripped away was in a round spiral form having an innermost radius of 0.9 mm and 11.5 turns.

Then, this pattern was subjected to bright copper sulfate plating by injecting a plating solution having a copper sulfate concentration of 70 g/l thereto through an orifice in a pipe located near a cathode at 25° C., an injection rate of 20 mm/sec., and a current density of 2.5 A/dm², thereby forming a 150-μm thick coil conductive plating layer of mushroomy y shape in section. The space between conductors was 10 μm.

Subsequently, a bright watts nickel bath containing 280 g/l of $NiSO_4 \cdot 7H_2O$, 45 g/l of $NiCl_2 \cdot 6H_2O$, and 40 g/l of $H_3BO_3$ was used to coat a 2-μm thick nickel plating thin-film layer all over the surface of the plating layer of the coil conductor.

After the thus obtained coil substrate was fully dried, its entire surface was irradiated with ultraviolet radiation using the nickeled copper coil conductive layer as a mask for exposure of only the positive photoresist present between the conductors. Then, the exposed regions were dissolved in a developing solution ("P-7G", Tokyo Oka Kogyo Co. Ltd.) for removal.

Following this, only the underlying thin-film layer exposed between the conductors were etched away by an alkali etching solution ("A-Process", Mertex Co., Ltd.). The obtained assembly was finally cut to 284 planar coils, each of which was found to have an outer size of 3.1×3.1×0.4 mm, a direct current resistance of 0.1 Ω, and an inductance value of 0.37 μH.

Comparative Example 2-1

Using a 100-μm thick glass epoxy substrate having 36-μm thick copper foils clad on both its surfaces, planar coils having the same shape as in Example 2-1 and an outer size of 3.1×3.1×0.2 mm were fabricated according to an ordinary process of fabricating printed circuit boards. Each of the planar coils was found to have a direct current resistance of 1.1 Ω and an inductance value of 0.37 μH.

As can be seen from this comparative example, planar coils fabricated by the conventional process of fabricating printed circuit boards have a direct current resistance at least 10 times as high as those fabricated by the process of the invention.

Example 2-2

A through-hole of 0.2 mm in diameter was provided through the same glass epoxy substrate as in Example 2-1 at a given position thereof. After this, 1-μm thick copper layers were plated on both surfaces of the substrate, using an electroless copper plating solution ("Build Copper", Okuno Pharmaceutical Co., Ltd.).

Then, a positive photoresist ("PMER P-AR900", Tokyo Oka Kogyo Co., Ltd.) was spin-coated on each copper layer at a dry thickness of 5 μm, and exposed to light and developed in a conventional manner, thereby forming a resist pattern having a pattern width of 90 μm and a pattern spacing of 20 μm. The through-hole was provided to make connections between the copper layers on both surfaces of the substrate. The thus obtained resist pattern was in a round spiral form having an innermost radius of 0.9 mm and 11.5 turns.

Then, this pattern was plated by injecting a plating solution having a copper sulfate concentration of 110 g/l thereto through an orifice in a pipe located near a cathode at an injection rate of 50 mm/sec., and a current density of 9 A/dm² until a plating thickness of 150 μm was obtained. In this way, a coil conductive plating layer of mushroomy shape in section was formed at a 10-μm spacing between conductors.

Subsequently, a bright watts nickel bath containing 280 g/l of $NiSO_4 \cdot 7H_2O$, 45 g/l of $NiCl_2 \cdot 6H_2O$, and 40 g/l of $H_3BO_3$ was used to coat a 2μm thick nickel plating thin-film layer all over the surface of the plating layer of the coil conductor.

After the thus obtained coil substrate was fully dried, its entire surface was irradiated with ultraviolet radiation using the nickeled copper coil conductive layer as a mask for exposure of only the positive photoresist present between the conductors. Then, the exposed regions were dissolved in a developing solution ("P-7G", Tokyo Oka Kogyo Co., Ltd.) for removal.

Following this, only the underlying thin-film layer exposed between the conductors were etched away by an alkali etching solution ("A-Process", Mertex Co., Ltd.). The obtained assembly was finally cut to 284 planar coils, each of which was found to have an outer size of 3.1×3.1×0.4 mm, a direct current resistance of 0.1 Ω, and an inductance value of 0.37 μH.

Comparative Example 2-2

Using a 100-μm thick glass epoxy substrate having 36-μm thick copper foils clad on both its surfaces, planar coils having the same shape as in Example 2-1 and an outer size of 3.1×3.1×0.2 mm were fabricated according to an ordinary process of fabricating printed circuit boards. Each of the planar coils was found to have a direct current resistance of 1.1 Ω and an inductance value of 0.37 μH.

As can be seen from this comparative example, planar coils obtained by the conventional process of fabricating printed circuit boards have a direct current resistance at least 10 times as high as those fabricated by the process of the invention.

Example 2-3

Using an electroless copper plating solution ("Build Copper", Okuno Pharmaceutical Co., Ltd.), a 1-μm thick copper layer was plated on one surface of an Nizn ferrite substrate ("7H", TDK) having a diameter of 3 inches, a thickness of 350 μm and a relative permeability of 800.

Then, a positive photoresist ("PMER P-AR900", Tokyo Oka Kogyo Co., Ltd.) was spin-coated on the copper layer at a dry thickness of 5 μm, and exposed to light and developed in a conventional manner, thereby forming a resist pattern having a pattern width of 90 μm and a pattern spacing of 20 μm. The resist pattern had an innermost radius of 0.9 mm and 5.75 turns.

Then, this pattern was subjected to bright copper sulfate plating by injecting a plating solution having a copper sulfate concentration of 70 g/l thereto through an orifice in a pipe located near a cathode at 25° C., an injection rate of 20 mm/sec., and a current density of 2.5 A/dm², thereby forming a 150-μm thick coil conductive plating layer of mushroomy shape in section. The spacing between conductors was 10 μm.

Subsequently, the same bright watts nickel bath as in Example 2-1 was used to coat a 2-μm thick nickel plating thin-film layer all over the surface of the plating layer of the coil conductor. After the thus obtained coil substrate was fully dried, its entire surface was irradiated with ultraviolet radiation using the nickeled copper coil conductive layer as a mask for exposure of only the positive photoresist present between the conductors. Then, the exposed regions were dissolved in a developing solution ("P-7G", Tokyo Oka Kogyo Co., Ltd.) for removal.

Following this, only the underlying thin-film layer exposed between the conductors were etched away by an alkali etching solution ("A-Process", Mertex Co., Ltd.). Then, a photosensitive epoxy resin was coated over the coil conductive portion with gaps by a curtain coating technique, followed by pre-curing. After this, a contact hole was provided in the cured epoxy resin at a given position, using a conventional photolithography technique, followed by curing. Then, the same operation as mentioned above was repeated using the photosensitive epoxy resin as an insulating substrate, thereby forming a second coil layer. In this way, an assembly of mulitilayer planar coils was obtained. Each of planar coils obtained by dividing this assembly was found to have an outer size of 3.1×3.1×0.7 mm. Each of the thus obtained planar coils was found to have such electric properties as represented by a direct current resistance of 0.1 Ω and an inductance value of 0.6 μH. The inductance value of the planar coil showed an about 50% increase with respect to that of the planar coil according to Example 2-1.

Example 2-4

Using an electroless copper plating solution ("Build Copper", Okuno Pharmaceutical Co., Ltd.), a 1-μm thick copper layer was plated on one surface of an NiZn composite ferrite substrate (consisting of 70% by weight of ferrite powders and 30% by weight of epoxy resin) having a diameter of 3 inches and a thickness of 300 μm.

Then, a positive photoresist ("PMER P-AR900", Tokyo Oka Kogyo Co., Ltd.) was spin-coated on the copper layer at a dry thickness of 5 μm, and exposed to light and developed in a conventional manner, thereby forming a resist pattern having a pattern width of 90 μm and a pattern spacing of 20 μm. The resist pattern was in a round spiral form having an innermost radius of 0.9 mm and 5.75 turns.

Then, this pattern was subjected to bright copper sulfate plating by injecting a plating solution having a copper sulfate concentration of 70 g/l thereto through an orifice in a pipe located near a cathode at 25° C., an injection rate of 20 mm/sec., and a current density of 2.5 A/dm², thereby forming a 150-μm thick coil conductive plating layer of mushroomy shape in section, with a spacing of 10 μm between conductors.

Subsequently, a bright watts nickel bath containing 280 g/l of $NiSO_4 \cdot 7H_2O$, 45 g/l of $NiCl_2 \cdot 6H_2O$, and 40 g/l of $H_3BO_3$ was used to coat a 2μm thick nickel plating thin-film layer all over the surface of the plating layer of the coil conductor.

After the thus obtained coil substrate was fully dried, its entire surface was irradiated with ultraviolet radiation using the nickeled copper coil conductive layer as a mask for exposure of only the positive photoresist present between the conductors. Then, the exposed regions were dissolved in a developing solution ("P-7G", Tokyo Oka Kogyo Co., Ltd.) for removal.

Following this, only the underlying thin-film layer exposed between the conductors were etched away by an alkali etching solution ("A-Process", Mertex Co., Ltd.). Then, a second coil layer was formed as in Example 2-3, thereby obtaining 284 planar coils, each having an outer size of 3.1×3.1×0.6 mm. The planar coil was found to have electric properties as represented by a direct current resistance of 0.1 Ω and an inductance value of 0.48 $\mu$H. Thus, the inductance value of this planar coil showed an about 30% increase with respect to that of the planar coil obtained in Example 2-1.

Example 2-5

After the planar coil obtained in Example 2-1 was drilled in its middle position, it was sandwiched between Nizn EI ferrite cores, each having an outer size of 3.2×3.2×1.3 mm to fabricate a planar coil. The inductance value of this planar coil was 11 $\mu$H, about 30 times as large as that of the planar coil of Example 2-1.

Example 2-6

A through-hole of 0.2 mm in diameter was provided through the same glass epoxy substrate as in Example 2-1 at a given position thereof. After this, 1-$\mu$m thick copper layers were formed on both surfaces of the substrate, using an electroless copper plating solution ("Build Copper", Okuno Pharmaceutical Co., Ltd.).

Then, a positive photoresist ("PMER P-A900", Tokyo Oka Kogyo Co., Ltd.) was spin-coated on each copper layer at a dry thickness of 5 $\mu$m to form a pattern having a pattern width of 200 $\mu$m and a pattern spacing of 20 $\mu$m as in Example 2-1. In this case, the through-hole was provided to make connections between both surfaces of the substrates. The thus obtained pattern was in a round spiral form hating an innermost radius of 0.9 mm and 6 turns.

Then, bright copper plating was performed until a plating thickness of 150 $\mu$m was obtained, using a copper sulfate plating bath containing 70 g/l of $CuSO_4$ and 200 g/l of $H_2SO_4$ while stirring a plating solution as in Example 2-1 at a current density of 2.5 A/$dm^2$ and a bath temperature of 25° C. In this way, a conductive layer of mushroomy shape in section was obtained at a 10-$\mu$m inter-conductor spacing.

Subsequently, a bright watts nickel bath containing 280 g/l of $NiSO_4 7H_2O$, 45 g/l of $NH_4Cl$, and 40 g/l of $H_3BO_3$ was used to carry out plating at a temperature of 25° C. and a current density of 1 A/$dm^2$ until a plating thickness of 2 $\mu$m was obtained.

After the thus obtained coil substrate was fully dried, its entire surface was irradiated from above with ultraviolet radiation using the nickeled copper coil conductive layer as a mask. Then, the exposed regions were dissolved in a developing solution ("P-7G", Tokyo Oka Kogyo Co., Ltd.) for removal.

Following this, only the underlying thin-film layer exposed between the conductors were etched away by an alkali etching solution ("A-Process", Mertex Co., Ltd.). Then, the assembly was cut to 284 planar coils, each having an outer size of 3.1×3.1×0.4 mm. The planar coil was found to have electric properties as represented by a direct current resistance of 0.05 Ω.

This planar coil was laminated on the planar coil obtained in Example 2-1 with an insulating polyester film interleaved between them. Following this, the assembly was sandwiched between NiZn EI ferrite cores, each having an outer size of 3.2×3.2×1.7 mm, thereby making up a planar transformer. The coupling coefficient was found to be 0.95 as measured at a frequency of 500 kHz.

Example 2-7

A 1-$\mu$m thick copper layer was laminated on a plastic substrate (an unclad BT resin substrate, Mitsubishi Gas Chemical Company Inc.), using an electroless copper plating solution ("Build Copper", Okuno Pharmaceutical Co., Ltd.).

Then, the same positive photoresist as in Example 2-1 was spin-coated on this multilayer structure at a dry thickness of 30 $\mu$m, and exposed to light and developed as in Example 2-1, thereby forming a spiral pattern having a pattern width of 20 $\mu$m and a pattern spacing of 20 $\mu$m in a range of 1.6×0.8 mm. The multilayer structure with this spiral pattern formed thereon was subjected to copper plating using a high-speed bright copper plating bath (110 g/l of $CuSO_4 \cdot 5H_2O$ and 180 g/l of $H_2SO_4$) and injecting a plating solution from an opened pipe located near a cathode at an injection speed of 50 mm/sec., a bath temperature of 35° C. and a current density of 9 A/$dm^2$, until a plating thickness of 35 $\mu$m was obtained. In this case, the spacing between conductors was 10 $\mu$m.

Subsequently, nickel plating was carried out at a temperature of 60° C. and a current density of 4 A/$dm^2$, using a bright watts nickel bath (280 g/l of $NiSO_4 \cdot 7H_2O$, 45 g/l of $NiCl_6 \cdot 6H_2O$, and 40 g/l of $H_3BO_3$) until a plating thickness of 2 $\mu$m was obtained.

After the thus obtained coil substrate was fully dried, its entire surface was irradiated with ultraviolet radiation as in Example 2-1, thereby making the positive photoresist between the conductors soluble in a solvent. Then, the exposed regions were dissolved in a developing solution ("P-7G", Tokyo Oka Kogyo Co., Ltd.) for removal.

Following this, only the underlying thin-film layer exposed between the conductors were selectively etched away by an alkali etching solution ("A-Process", Mertex Co., Ltd.). Then, the assembly was cut to 1,800 planar coils, each having an outer size of 1.6×0.8×0.3 mm. The planar coil was found to show favorable frequency performance at about 1 GHz.

Japanese Patent Nos. 3853/1997 and 3854/1997 are herein incorporated by reference.

Although some preferred embodiments have been described, many modifications and variations may be made thereto in the light of the above teachings. It is therefore to be understood that within the scope of the appended claims, the invention may be carried out otherwise than as specifically described.

I claim:

1. A planar coil comprising:
   an insulating substrate; and
   a coil conductive filament having a thickness of 20 to 400-$\mu$m and formed on at least one surface of said insulating substrate, said coil conductive filament having a gap whose aspect ratio (H/G) is at least 1;
   wherein said coil conductive filament has a cross-section in a substantially mushroom shape having a neck and a substantially quadrilateral head formed on said neck, said substantially quadrilateral head has a width (L) which is at least twice as large as a width (l) of said neck thereof, at most 1.5 times as large as a height of said substantially quadrilateral head, and at least twice as large as a minimum spacing (G) between adjacent coil conductive filaments.

2. The planar coil according to claim 1, wherein said coil conductive filament is covered with a protective metal plating thin-film layer.

3. A planar transformer comprising a plurality of planar coils, wherein said plurality of planar coils each comprises the planar coils recited in claim 1 and is laminated one upon another with an insulating film interleaved therebetween to obtain a multilayer structure, and said multilayer structure is sandwiched between low-profile ferromagnetic cores.

4. The planar transformer according to claim 3, wherein said coil conductive filament is covered with a protective metal plating thin-film layer.

5. A planar coil comprising:

an insulating substrate; and a coil conductive filament having a thickness of 20 to 400-$\mu$m and formed on at least one surface of said insulating substrate, said coil conductive filament having a gap whose aspect ratio (H/G) is at least 1;

wherein said coil conductive filament has a cross-section in a substantially mushroom shape having a neck and a substantially quadrilateral head formed on said neck, said substantially quadrilateral head has a width (L) which is at least twice as large as a width (l) of said neck thereof, at most 1.5 times as large as a height of said substantially quadrilateral head, and at least twice as large as a minimum spacing (G) between adjacent loops of said coil conductive filament.

6. The planar coil according to claim 5, wherein said coil conductive filament is covered with a protective metal plating thin-film layer.

7. A planar transformer comprising a plurality of planar coils, wherein said plurality of planar coils each comprises the planar coils recited in claim 5, and is laminated one upon another with an insulating film interleaved therebetween to obtain a multilayer structure, and said multilayer structure is sandwiched between low-profile ferromagnetic cores.

8. The planar transformer according to claim 7, wherein said coil conductive filament is covered with a protective metal plating thin-film layer.

* * * * *